US010607973B2

(12) United States Patent
Chang et al.

(10) Patent No.: US 10,607,973 B2
(45) Date of Patent: *Mar. 31, 2020

(54) MICRO-LED ARRAY DISPLAY DEVICES WITH CMOS CELLS

(71) Applicant: LUMENS CO., LTD., Yongin-si, Gyeonggi-do (KR)

(72) Inventors: HanBeet Chang, Yongin-si (KR); EunSung Shin, Yongin-si (KR); HyunYong Cho, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 15 days.

This patent is subject to a terminal disclaimer.

(21) Appl. No.: 16/046,176

(22) Filed: Jul. 26, 2018

(65) Prior Publication Data

US 2018/0331086 A1 Nov. 15, 2018

Related U.S. Application Data

(63) Continuation of application No. 15/613,233, filed on Jun. 4, 2017, now Pat. No. 10,062,675.

(30) Foreign Application Priority Data

Jul. 18, 2016 (KR) .......................... 10-2016-0090600

(51) Int. Cl.
*H01L 25/16* (2006.01)
*H01L 33/36* (2010.01)
(Continued)

(52) U.S. Cl.
CPC ........ *H01L 25/167* (2013.01); *H01L 25/0753* (2013.01); *H01L 27/156* (2013.01); *H01L 33/36* (2013.01); *H01L 33/382* (2013.01); *H01L 33/62* (2013.01); *H01L 27/124* (2013.01); *H01L 27/1218* (2013.01); *H01L 2933/0066* (2013.01)

(58) Field of Classification Search
CPC ............................ H01L 25/167; H01L 27/156
See application file for complete search history.

(56) References Cited

U.S. PATENT DOCUMENTS

2004/0115849 A1* 6/2004 Iwafuchi ............. H01L 21/2007
438/25
2005/0087747 A1* 4/2005 Yamada .................... G02B 6/43
257/80
2011/0233589 A1* 9/2011 Kim ...................... H01L 33/405
257/98

FOREIGN PATENT DOCUMENTS

JP H08-304739 A 11/1996
JP 2001-326388 A 11/2001
(Continued)

*Primary Examiner* — Allen L Parker
*Assistant Examiner* — Gustavo G Ramallo
(74) *Attorney, Agent, or Firm* — Mei & Mark LLP

(57) ABSTRACT

Micro-LED array display devices are disclosed. One of the micro-LED display devices includes: a micro-LED panel including a plurality of micro-LED pixels; a CMOS backplane including a plurality of CMOS cells corresponding to the micro-LED pixels to individually drive the micro-LED pixels; and bumps electrically connecting the micro-LED pixels to the corresponding CMOS cells in a state in which the micro-LED pixels are arranged to face the CMOS cells. The micro-LED pixels are flip-chip bonded to the corresponding CMOS cells formed on the CMOS backplane through the bumps so that the micro-LED pixels are individually controlled.

12 Claims, 4 Drawing Sheets

(51) Int. Cl.
    *H01L 25/075*     (2006.01)
    *H01L 27/15*     (2006.01)
    *H01L 33/38*     (2010.01)
    *H01L 33/62*     (2010.01)
    *H01L 27/12*     (2006.01)

(56) References Cited

FOREIGN PATENT DOCUMENTS

| | | |
|---|---|---|
| JP | 2001-343706 A | 12/2001 |
| JP | 2006-012916 A | 1/2016 |

\* cited by examiner

MICRO-LED ARRAY DISPLAY DEVICES WITH CMOS CELLS

CROSS-REFERENCE TO RELATED APPLICATION(S)

This application is a continuation of U.S. patent application Ser. No. 15/613,233, filed Jun. 4, 2017, which claims the benefit of Korean Patent Application No. 10-2016-0090600, filed Jul. 18, 2016. The contents of these applications are incorporated herein by reference.

TECHNICAL FIELD

The present invention relates to micro-LED array display devices, and more specifically to micro-LED array display devices in which a plurality of micro-LED pixels are arrayed on one micro-LED panel by etching for the production of LED chips and the pixel-arrayed micro-LED panel is flip-chip bonded to a CMOS backplane through bumps so that the micro-LED pixels can be individually driven, thus being suitable for microdisplay applications.

BACKGROUND

Demand for light emitting diodes (LEDs) has expanded exponentially in terms of low power consumption and environmental friendliness. LEDs are used as backlights for lighting apparatuses and LCD devices and are widely applied to display devices.

LEDs are kinds of solid-state elements that convert electrical energy into light. LEDs are based on the principle that when a voltage is applied between two doped layers, i.e. an n-type semiconductor layer and a p-type semiconductor layer, between which an active layer is interposed, electrons and holes are injected into and recombine in the active layer to emit light. LEDs can be driven at relatively low voltage and have high energy efficiency. Due to these advantages, LEDs release a small amount of heat. LEDs can be produced in various types. Particularly, micro-LED array display devices are fabricated based on types of LEDs in which a plurality of micro-LED pixels are formed on one wafer. According to a conventional method for the fabrication of a micro-LED array display device in which a plurality of micro-LED pixels are formed on one wafer, a p-type terminal and an n-type terminal are formed in each pixel through a chip production process and are arrayed along the longitudinal and transverse axes of signal lines to drive the pixel. In this case, elements responsible for signal control in the micro-LED pixels should be disposed in the vicinity of the micro-LED pixels, resulting in an increase in the size of the micro-LED array display device. Further, data lines arrayed along the longitudinal and transverse axes should be connected to the micro-LED pixels by wire bonding, making the process complicated and inconvenient.

The formation of a plurality of micro-LED pixels on one substrate technically limits the production of structures emitting red, green, and blue light. Because of this technical difficulty, the use of LEDs as light sources in micro-LED array display devices inevitably leads to the emission of monochromatic light. Thus, there is a need in the art for an approach that can provide a solution to the problems of the prior art.

SUMMARY

One object of the present invention is to provide a micro-LED array display device in which micro-LED pixels are flip-chip bonded to corresponding CMOS cells formed on a CMOS backplane through bumps, thus avoiding the complexity and inconvenience of wire bonding for connecting micro-LED pixels to various data lines while enabling individual control of the micro-LED pixels.

A further object of the present invention is to provide a micro-LED array display device in which micro-LED panels, each including a plurality of micro-LED pixels, are flip-chip bonded to a single CMOS backplane, thus overcoming the difficulties of the prior art in forming red, green, and blue light emitting structures including micro-LED pixels formed on one substrate.

According to one aspect of the present invention, there is provided a micro-LED array display device including: a micro-LED panel including a plurality of micro-LED pixels; a CMOS backplane including a plurality of CMOS cells corresponding to the micro-LED pixels to individually drive the micro-LED pixels; and bumps electrically connecting the micro-LED pixels to the corresponding CMOS cells in a state in which the micro-LED pixels are arranged to face the CMOS cells, wherein the micro-LED pixels are flip-chip bonded to the corresponding CMOS cells formed on the CMOS backplane through the bumps so that the micro-LED pixels are individually controlled.

According to one embodiment, the micro-LED pixels are formed by growing a first conductivity-type semiconductor layer, an active layer, and a second conductivity-type semiconductor layer in this order on a substrate and etching the layers, the micro-LED pixels have a vertical structure including the first conductivity-type semiconductor layer, the active layer, and the second conductivity-type semiconductor layer formed in this order, and the active layer and the second conductivity-type semiconductor layer are removed from the exposed portions of the first conductivity-type semiconductor layer where none of the micro-LED pixels are formed.

According to one embodiment, a first conductivity-type metal layer is formed over the portions of the first conductivity-type semiconductor layer where none of the micro-LED pixels are formed and is spaced apart from the micro-LED pixels.

According to one embodiment, the first conductivity-type metal layer is formed along the periphery of the micro-LED panel on the first conductivity-type semiconductor layer.

According to one embodiment, the first conductivity-type metal layer has the same height as the micro-LED pixels.

According to one embodiment, the first conductivity-type metal layer functions as a common electrode of the micro-LED pixels.

According to one embodiment, the CMOS backplane includes a common cell formed at a position corresponding to the first conductivity-type metal layer and the first conductivity-type metal layer is electrically connected to the common cell through a common bump.

According to one embodiment, the first conductivity-type is n-type and the second conductivity-type is p-type.

According to one embodiment, the substrate is made of a material selected from sapphire, SiC, Si, glass, and ZnO.

According to one embodiment, the bumps are formed on the CMOS cells and are melted by heating such that the CMOS cells are electrically connected to the corresponding micro-LED pixels.

According to a further aspect of the present invention, there is provided a micro-LED array display device including: first, second, and third micro-LED panels emitting light of different wavelength bands, each of the micro-LED panels including a plurality of micro-LED pixels; a single CMOS backplane including a plurality of CMOS cells corresponding to the micro-LED pixels of the first, second, and third micro-LED panels to individually drive the micro-LED pixels; and bumps electrically connecting the micro-LED pixels of the first, second, and third micro-LED panels to the corresponding CMOS cells in a state in which the micro-LED pixels of the first, second, and third micro-LED panels are arranged to face the CMOS cells, wherein the micro-LED pixels of the first, second, and third micro-LED panels are flip-chip bonded to the corresponding CMOS cells formed on the CMOS backplane through the bumps so that the micro-LED pixels are individually controlled.

In the new concept of micro-LED array display device according to the present invention, micro-LED pixels are flip-chip bonded to micro-LED pixels formed on a CMOS backplane through bumps, avoiding the complexity and inconvenience of wire bonding for connecting micro-LED pixels to various data lines while enabling individual control of the micro-LED pixels. The micro-LED array display device of the present invention in which a plurality of micro-LED panels emitting red, green, and blue light are flip-chip bonded to a single CMOS backplane through bumps can focus three colors on the same area using an optical system to achieve full color. Therefore, the micro-LED array display device of the present invention is effective in overcoming the technical difficulties of the prior art in forming red, green, and blue light emitting structures including a plurality of micro-LED pixels on one substrate.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

The present invention is directed to a micro-LED array display device in which micro-LED pixels are arrayed by MESA etching and are flip-chip bonded to a CMOS backplane, thus being applicable to a micro display, such as a head mounted display (HMD) or head up display (HUD). In the micro-LED array display device of the present invention, micro-LED pixels arrayed by MESA etching for the production of LED chips are flip-chip bonded to a CMOS backplane so that they can be individually driven. The present invention is also directed to a micro-LED array display device in which three red, green, and blue light emitting elements, i.e. micro-LED panels, are arrayed on a CMOS backplane to achieve full color.

Preferred embodiments of the present invention will now be described with reference to the accompanying drawings. The drawings and embodiments described with reference to the drawings are simplified and illustrated such that those skilled in the art can readily understand the present invention. Accordingly, the drawings and the embodiments should not be construed as limiting the scope of the present invention.

Figure 1:
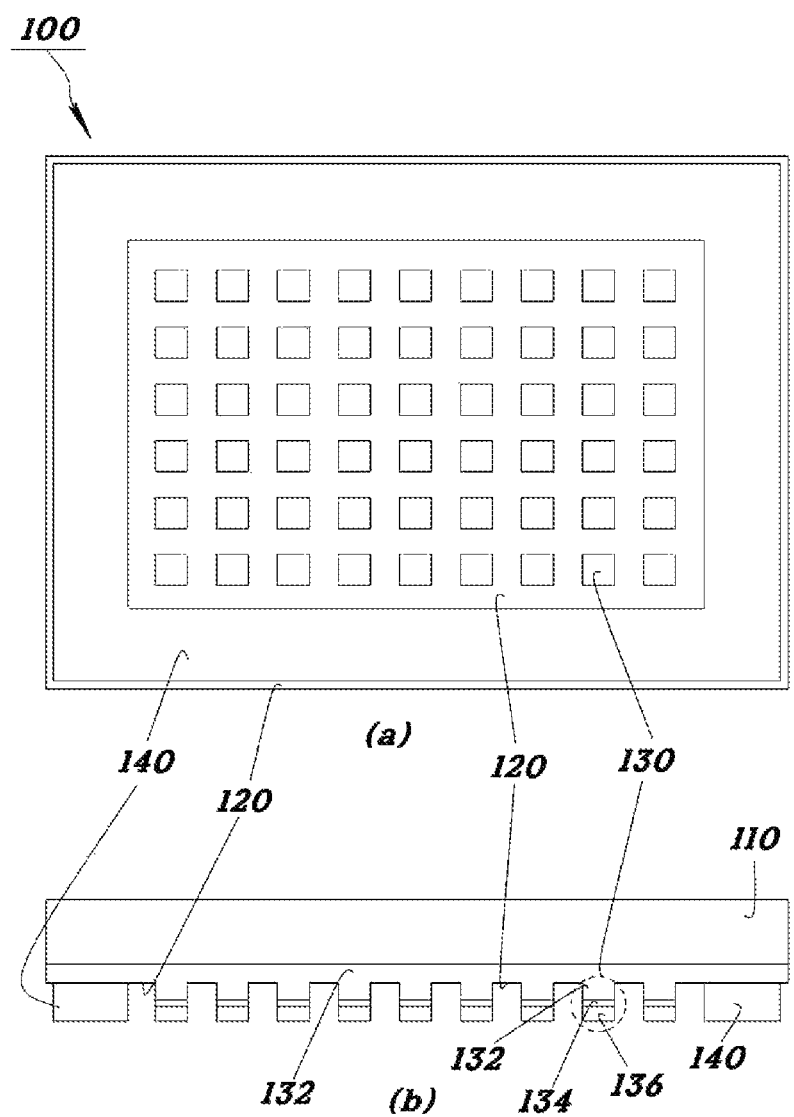
FIG. 1 illustrates an exemplary micro-LED panel 100 of a micro-LED array display device according to one embodiment of the present invention.
Figure 2:
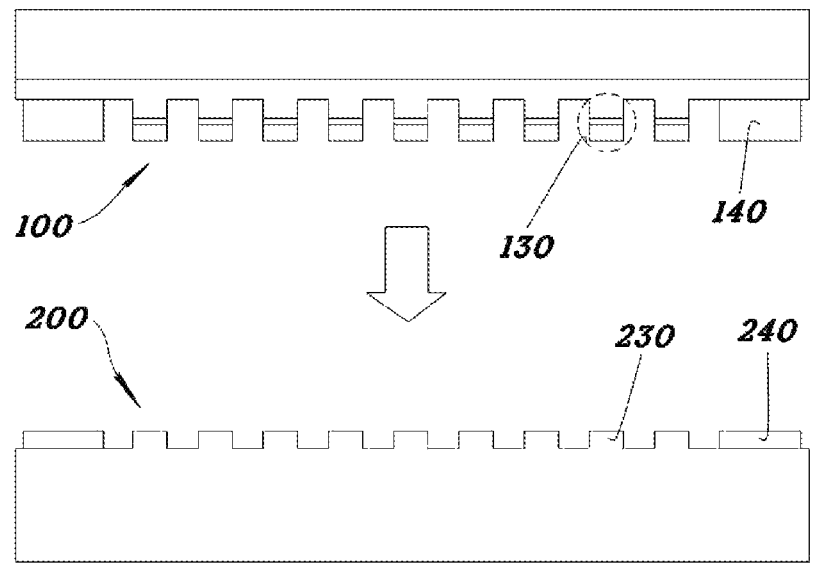
FIG. 2 illustrates the micro-LED panel 100 of FIG. 1 including micro-LED pixels and a CMOS backplane 200 including a plurality of CMOS cells adapted to individually drive the micro-LED pixels of the micro-LED panel 100.
Figure 3:
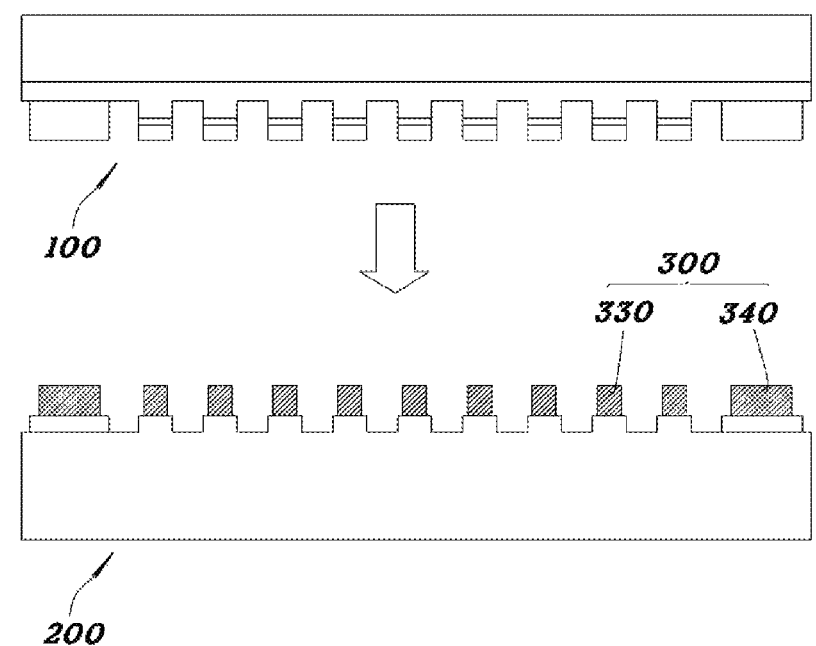
FIG. 3 illustrates a state in which the micro-LED panel 100 and the CMOS backplane 200 illustrated in FIG. 2 are electrically connected to each other through bumps 300 arranged on the CMOS backplane 200.
Figure 4:
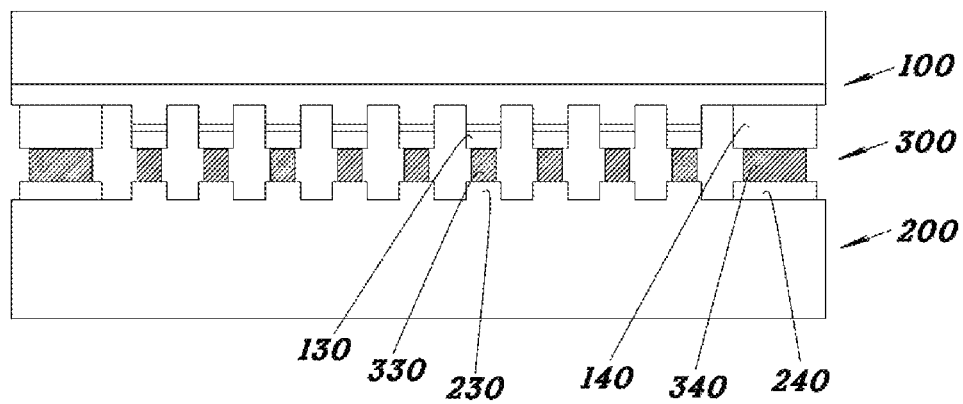
FIG. 4 illustrates a state in which the micro-LED panel 100 and the CMOS backplane 200 illustrated in FIG. 3 are arranged to face each other through the bumps 300 to electrically connect the micro-LED pixels of the micro-LED panel 100 to the CMOS cells of the CMOS backplane 200.

FIG. 1 illustrates an exemplary micro-LED panel 100 of a micro-LED array display device according to one embodiment of the present invention, FIG. 2 illustrates the micro-LED panel 100 including micro-LED pixels and a CMOS backplane 200 including a plurality of CMOS cells adapted to individually drive the micro-LED pixels of the micro-LED panel 100, FIG. 3 illustrates a state in which the micro-LED panel 100 and the CMOS backplane 200 are electrically connected to each other through bumps 300 arranged on the CMOS backplane 200, and FIG. 4 illustrates a state in which the micro-LED panel 100 and the CMOS backplane 200 are arranged to face each other through the bumps 300 to electrically connect the micro-LED pixels of the micro-LED panel 100 to the CMOS cells of the CMOS backplane 200.

Referring first to FIGS. 1 to 4, a description will be given of a micro-LED array display device according to one embodiment of the present invention. The micro-LED array display device includes a micro-LED panel 100, a CMOS backplane 200, and bumps 300. The micro-LED panel 100 includes a plurality of micro-LED pixels 130. The CMOS backplane 200 includes a plurality of CMOS cells 230 corresponding to the micro-LED pixels 130 to individually drive the micro-LED pixels 130. The micro-LED pixels 130 are electrically connected to the corresponding CMOS cells 230 through the bumps 300 in a state in which the micro-LED pixels 130 are arranged to face the CMOS cells 230. In FIGS. 1 to 4, only one of the micro-LED pixels and only one of the CMOS cells are denoted by reference numerals 130 and 230, respectively, for the purpose of convenience. The micro-LED pixels 130 are flip-chip bonded to the corresponding CMOS cells 230 formed on the CMOS backplane 200 through the bumps 300. Due to this construction, the micro-LED pixels 130 can be individually controlled.

The micro-LED pixels 130 of the micro-LED panel 100 are formed by growing a first conductivity-type semiconductor layer 132, an active layer 134, and a second conductivity-type semiconductor layer 136 in this order on a substrate 110 and etching the layers. The micro-LED pixels have a vertical structure including the first conductivity-type semiconductor layer 132, the active layer 134, and the second conductivity-type semiconductor layer 136 formed in this order on the substrate 110. The substrate 110 may be made of a material selected from sapphire, SiC, Si, glass, and ZnO. The first conductivity-type semiconductor layer 132 may be an n-type semiconductor layer and the second conductivity-type semiconductor layer 136 may be a p-type semiconductor layer. The active layer 134 is a region where electrons from the first conductivity-type semiconductor layer 132 recombine with holes from the second conductivity-type semiconductor layer 136 when power is applied.

The second conductivity-type semiconductor layer 136 and the active layer 134 are removed from the etched portions 120 of the micro-LED panel 100 where none of the micro-LED pixels 130 are formed, and as a result, the first conductivity-type semiconductor layer is exposed in the etched portions. The micro-LED panel 100 includes a first conductivity-type metal layer 140 formed over the portions 120 of the first conductivity-type semiconductor layer 132 where none of the micro-LED pixels 130 are formed. The first conductivity-type metal layer 140 is spaced apart from the micro-LED pixels 130. The first conductivity-type metal layer 140 is formed with a predetermined width along the periphery of the micro-LED panel 100 on the first conductivity-type semiconductor layer 132. The first conductivity-type metal layer 140 has substantially the same height as the micro-LED pixels 130. The first conductivity-type metal layer 140 is electrically connected to the CMOS backplane 200 through the bumps 300. As a result, the first conductivity-type metal layer 140 functions as a common electrode of the micro-LED pixels 130. For example, the first conductivity-type metal layer 140 may be a common ground.

The plurality of CMOS cells 230 of the CMOS backplane 200 serve to individually drive the micro-LED pixels 130. The CMOS cells 230 are electrically connected to the corresponding micro-LED pixels through bumps 330. The CMOS cells 230 are integrated circuits for individually driving the corresponding micro-LED pixels. The CMOS backplane 200 may be, for example, an active matrix (AM) panel. Specifically, each of the CMOS cells 230 may be a pixel driving circuit including two transistors and one capacitor. When the micro-LED panel 100 is flip-chip bonded to the CMOS backplane 200 through the bumps 300, each of the micro-LED pixels may be arranged between a drain terminal and a common ground terminal (e.g., reference numeral 240) of a transistor of the pixel driving circuit to form an equivalent circuit.

The CMOS backplane 200 includes a common cell 240 formed at a position corresponding to the first conductivity-type metal layer 140. The first conductivity-type metal layer 140 is electrically connected to the common cell 240 through a common bump 340. Herein, the bumps 300 is often intended to include the bumps 330 electrically connecting the plurality of CMOS cells to the micro-LED pixels and the common bump 340 electrically connecting the first conductivity-type metal layer 140 to the common cell 240.

As illustrated in FIG. 3, the CMOS backplane 200 on which the CMOS cells 230 are arranged faces the micro-LED panel 100. After the CMOS cells 230 are brought into contact with the micro-LED pixels 130 in a one-to-one relationship, the bumps 330 and the common bump 340 are melted by heating. As a result, the CMOS cells 230 are electrically connected to the corresponding micro-LED pixels 130, as illustrated in FIG. 4.

Figure 5:
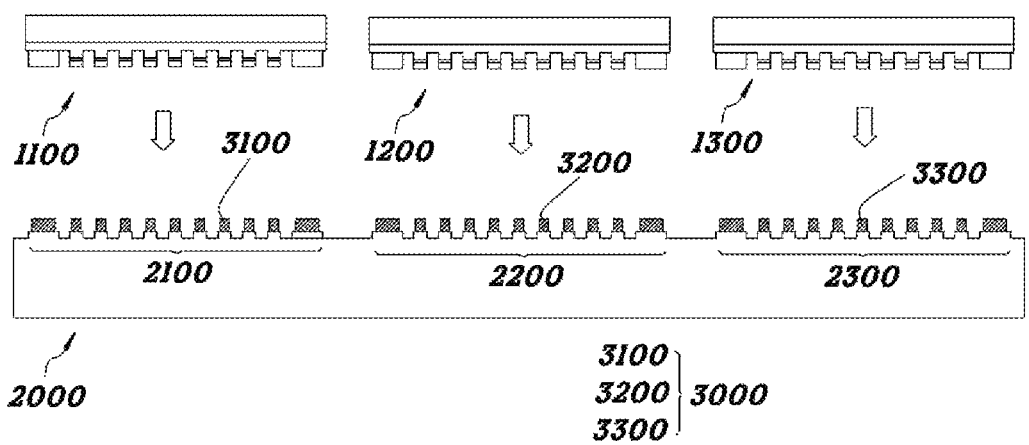
FIG. 5 illustrates a state in which red, green, and blue micro-LED panels 1100, 1200, and 1300, a single CMOS backplane 2000 having CMOS cell areas 2100, 2200, and 2300 where the micro-LED panels 1100, 1200, and 1300 are to be electrically connected to CMOS cells, and bumps 3000 arranged on the CMOS cells to achieve full color in a micro-LED array display device according to one embodiment of the present invention.
Figure 6:
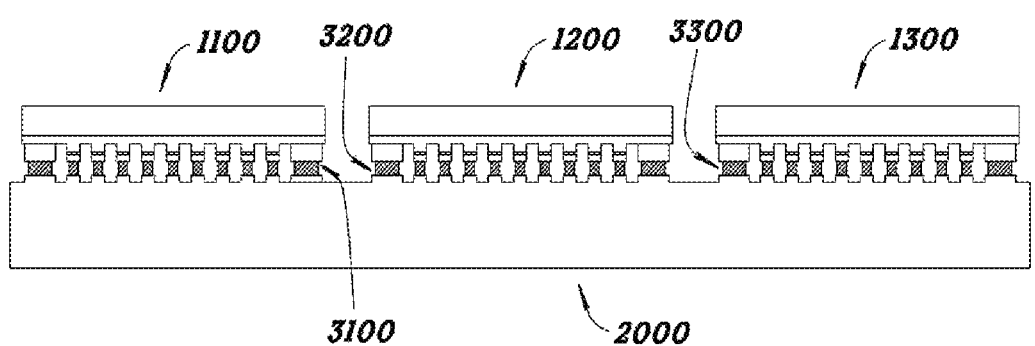
FIG. 6 illustrates a state in which the red, green, and blue micro-LED panels 1100, 1200, and 1300 are electrically connected to the single CMOS backplane 2000 through the bumps 3000 in the micro-LED array display device of FIG. 5.

Referring next to FIGS. 5 and 6, a description will be given of a micro-LED array display device capable of achieving full color according to a further embodiment of the present invention. FIG. 5 illustrates a state in which red, green, and blue micro-LED panels 1100, 1200, and 1300, a single CMOS backplane 2000 having CMOS cell areas 2100, 2200, and 2300 where the micro-LED panels 1100, 1200, and 1300 are to be electrically connected to CMOS cells, and bumps 3000 arranged on the CMOS cells to achieve full color in a micro-LED array display device according to one embodiment of the present invention and FIG. 6 illustrates a state in which the red, green, and blue micro-LED panels 1100, 1200, and 1300 are electrically connected to the single CMOS backplane 2000 through the bumps 3000.

Referring to these figures, the micro-LED array display device capable of achieving full color includes a first micro-LED panel 1100, a second micro-LED panel 1200, and a third micro-LED panel 1300, each of which includes a plurality of arrayed micro-LED pixels. The first 1100, second 1200, and third micro-LED panels 1300 emit light of different wavelength bands. For example, the first, second, and third micro-LED panels 1100, 1200, and 1300 may be constructed to emit red light, green light, and blue light, respectively. The micro-LED array display device capable of achieving full color includes a single CMOS backplane 2000 adapted to individually drive the micro-LED pixels of the first, second, and third micro-LED panels 1100, 1200, and 1300. The single CMOS backplane 2000 includes a plurality of CMOS cells corresponding to the micro-LED pixels of the first, second, and third micro-LED panels 1100, 1200, and 1300. CMOS cell areas 2100, 2200, and 2300 are formed in the CMOS backplane 2000 such that the micro-LED panels 1100, 1200, and 1300 are arranged on the CMOS backplane 2000. The CMOS cell areas 2100, 2200, and 2300 are formed corresponding to the micro-LED panels 1100, 1200, and 1300, respectively. The micro-LED panels 1100, 1200, and 1300 are flip-chip bonded to the CMOS cell areas 2100, 2200, and 2300, respectively. A plurality of CMOS cells corresponding to the micro-LED pixels of the micro-LED panels 1100, 1200, and 1300 are formed in the CMOS cell areas 2100, 2200, and 2300, respectively. With this arrangement, the micro-LED panels 1100, 1200, and 1300 are flip-chip bonded to the single CMOS backplane 2000 to electrically connect the micro-LED pixels to the CMOS cells. The CMOS cells are electrically connected to the micro-LED pixels through bumps 3000. The flip-chip bonding of the micro-LED panels 1100, 1200, and 1300 to the single CMOS backplane 2000 is performed in the same manner as that of the micro-LED panel 100 to the CMOS backplane 200 explained with reference to FIGS. 1 to 4.

Common cells are formed in the CMOS cell areas 2100, 2200, and 2300 on the single CMOS backplane 2000 and are electrically connected to first conductivity-type metal layers of the micro-LED panels 1100, 1200, and 1300 through common bumps.

As described before, the micro-LED array display device of the present invention in which the plurality of independently fabricated micro-LED panels emitting light of different wavelength bands, i.e. red, light, and blue light, are flip-chip bonded to the single CMOS backplane 2000 can focus three colors on the same area using an optical system to achieve full color, thus overcoming the technical difficulties of the prior art in forming red, green, and blue light emitting structures on one substrate in the fabrication of micro-LEDs. In addition, the micro-LED array display device of the present invention can avoid the inconvenience or difficulty of wire bonding for connecting LED chips to various data lines, which run along the longitudinal and transverse axes and are responsible for the control of the LED chips. Furthermore, the micro-LED array display device of the present invention can eliminate the need to dispose elements responsible for signal control in LED chips at positions away from the LED chips, contributing to a reduction in the overall size of the display device.

Figure 7:
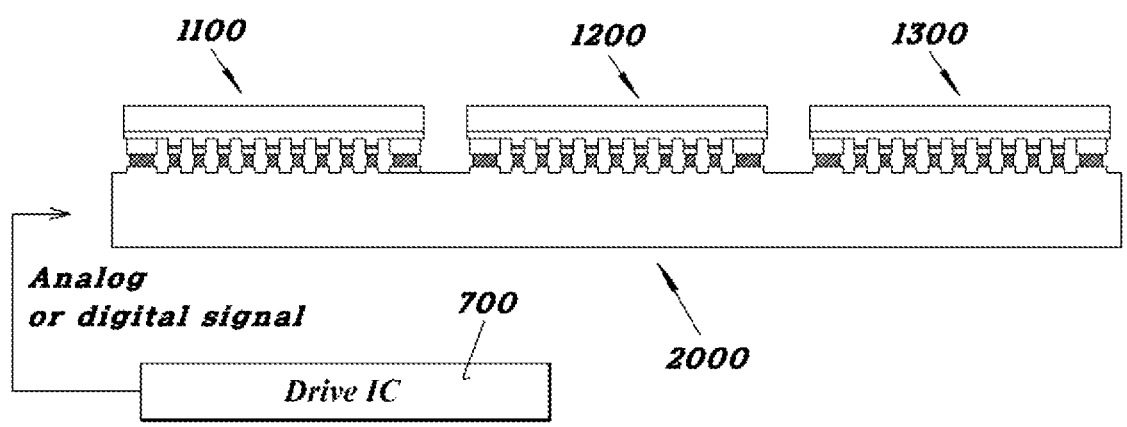
FIG. 7 is a view for briefly explaining the driving of the micro-LED array display device illustrated in FIG. 5 to achieve full color.

Finally, FIG. 7 is a view for briefly explaining the driving of the micro-LED array display device illustrated in FIG. 5 to achieve full color. As illustrated in FIG. 7, the micro-LED array display device is driven in response to control signals from a drive IC 700. The control signals from the drive IC 700 are transmitted to the micro-LED pixels by the CMOS cells (i.e. CMOS integrated circuits) formed in the CMOS backplane 2000. The control signals from the drive IC 700 may be analog or digital signals. The digital signals may also be pulse width modulation (PWM) signals.

EXPLANATION OF REFERENCE NUMERALS

100, 1100, 1200, 1300: Micro-LED panels
110: Substrate
120, 132: First conductivity-type semiconductor layers
130: Micro-LED pixel
134: Active layer
136: Second conductivity-type semiconductor layer
140: First conductivity-type metal layer
200, 2000: CMOS backplanes
230: CMOS cell
240: Common cell
340: Common bump
300, 330, 3000, 3100, 3200, 3300: Bumps
2100, 2200, 2300: CMOS cell areas
700: Drive IC

What is claimed is:

1. A micro-LED array display device comprising:
a micro-LED panel comprising a plurality of micro-LED pixels;
a CMOS backplane comprising a plurality of CMOS cells corresponding to the micro-LED pixels;
bumps electrically connecting the micro-LED pixels to the corresponding CMOS cells in a state in which the micro-LED pixels are arranged to face the CMOS cells; and
a first conductivity-type metal layer formed along the periphery of the micro-LED panel and located between the micro-LED panel and the CMOS backplane,
wherein the micro-LED pixels are flip-bonded to the corresponding CMOS cells formed on the CMOS backplane through the bumps so that the micro-LED pixels are individually controlled,
wherein the micro-LED pixels are formed by growing a first conductivity-type semiconductor layer, an active layer, and a second conductivity-type semiconductor layer in order on a substrate, etching the layers to form a vertical structure comprising the first conductivity-type semiconductor layer, the active layer, and the second conductivity-type semiconductor layer in order, and removing the active layer and the second conductivity-type semiconductor layer from exposed portions of the first conductivity-type semiconductor layer where none of the micro-LED pixels are formed,
wherein the first conductivity-type metal layer is formed over the portions of the first conductivity-type semiconductor layer where none of the micro-LED pixels are formed and is spaced apart from the micro-LED pixels, and
wherein the first conductivity-type metal layer functions as a common electrode of the micro-LED pixels.

2. The micro-LED array display device according to claim 1, wherein the first conductivity-type metal layer has the same height as the micro-LED pixels.

3. The micro-LED array display device according to claim 1, wherein the CMOS backplane comprises a common cell formed at a position corresponding to the first conductivity-type metal layer and the first conductivity-type metal layer is electrically connected to the common cell through a common bump.

4. The micro-LED array display device according to claim 1, wherein the first conductivity-type is n-type and the second conductivity-type is p-type.

5. The micro-LED array display device according to claim 1, wherein the substrate is made of a material selected from sapphire, SiC, Si, glass, and ZnO.

6. The micro-LED array display device according to claim 1, wherein the bumps are formed on the CMOS cells and are melted by heating such that the CMOS cells are electrically connected to the corresponding micro-LED pixels.

7. A micro-LED array display device comprising:
first, second, and third micro-LED panels emitting light of different wavelength bands, each of the micro-LED panels comprising a plurality of micro-LED pixels;
a single CMOS backplane comprising a plurality of CMOS cells corresponding to the micro-LED pixels;
bumps electrically connecting the micro-LED pixels of the first, second, and third micro-LED panels to the corresponding CMOS cells in a state in which the micro-LED pixels of the first, second, and third micro-LED panels are arranged to face the CMOS cells; and
a first conductivity-type metal layer of each of the first, second, and third micro-LED panels being formed along the periphery of the micro-LED panel and located between the micro-LED panels and the single CMOS backplane,
wherein the micro-LED pixels of the first, second, and third micro-LED panels are flip-bonded to the corresponding CMOS cells formed on the CMOS backplane through the bumps so that the micro-LED pixels are individually controlled,
wherein the micro-LED pixels of each of the first, second, and third micro-LED panels are formed by growing a first conductivity-type semiconductor layer, an active layer, and a second conductivity-type semiconductor layer in order on a substrate, etching the first conductivity-type semiconductor layer, the active layer, and the second conductivity-type semiconductor layers such that the micro-LED pixels of each of the first, second, and third micro-LED panels have a vertical structure comprising the substrate, the first conductivity-type semiconductor layer, the active layer, and the second conductivity-type semiconductor layer formed in order, and removing the active layer and the second conductivity-type semiconductor layer from exposed portions of the first conductivity-type semiconductor layer where none of the micro-LED pixels of each of the first, second, and third micro-LED panels are formed,
wherein the first conductivity-type metal layer is formed over the portions of the first conductivity-type semiconductor layer where none of the micro-LED pixels of each of the first, second, and third micro-LED panels are formed and is spaced apart from the micro-LED pixels of each of the first, second, and third micro-LED panels, and wherein the first conductivity-type metal layer of each of the first, second, and third micro-LED panels functions as a common electrode of the micro-LED pixels of the micro-LED panel.

8. The micro-LED array display device according to claim 7, wherein the first conductivity-type metal layer of each of the first, second, and third micro-LED panels has the same height as the micro-LED pixels of the micro-LED panel.

9. The micro-LED array display device according to claim 7, wherein the single CMOS backplane comprises a common cell formed at a position corresponding to the first conductivity-type metal layer of each of the first, second, and third micro-LED panels and the first conductivity-type metal layer is electrically connected to the common cell through a common bump.

10. The micro-LED array display device according to claim 7, wherein the first conductivity-type is n-type and the second conductivity-type is p-type.

11. The micro-LED array display device according to claim 7, wherein the substrate is made of a material selected from sapphire, SiC, Si, glass, and ZnO.

12. The micro-LED array display device according to claim 7, wherein the bumps are formed on the CMOS cells and are melted by heating such that the CMOS cells are electrically connected to the corresponding micro-LED pixels.

* * * * *